United States Patent [19]

Yamagiwa et al.

[11] 4,193,084

[45] Mar. 11, 1980

[54] VIDEO RECORDER HAVING MEANS FOR MAINTAINING CONSTANT THE AMPLITUDE OF THE FREQUENCY-MODULATED SIGNAL

[75] Inventors: Kazuo Yamagiwa, Tokyo; Kaneo Saito, Yokohama; Toshihiko Numakura, Kamakura, all of Japan

[73] Assignee: Sony Corporation, Tokyo, Japan

[21] Appl. No.: 841,793

[22] Filed: Oct. 13, 1977

[30] Foreign Application Priority Data

Oct. 20, 1976 [JP] Japan ................... 51-125829

[51] Int. Cl.$^2$ .................... H04N 5/785; G11B 5/04
[52] U.S. Cl. ........................... 358/4; 360/30; 360/33
[58] Field of Search ............... 358/4.8, 127–130, 358/186; 325/147, 187; 360/30, 33; 332/18

[56] References Cited

U.S. PATENT DOCUMENTS

| | | | |
|---|---|---|---|
| 1,849,620 | 3/1932 | Hansell | 325/147 |
| 2,081,577 | 5/1937 | Crosby | 325/147 |
| 3,205,442 | 9/1965 | Stamboulis | 325/320 |
| 3,283,252 | 11/1966 | Mead et al. | 325/147 |
| 3,715,468 | 2/1973 | Fujita | 358/4 |
| 3,969,755 | 7/1976 | Arimura et al. | 358/4 |
| 4,012,771 | 3/1977 | Ishigaki et al. | 358/4 |

*Primary Examiner*—John C. Martin
*Attorney, Agent, or Firm*—Lewis H. Eslinger; Alvin Sinderbrand

[57] ABSTRACT

In apparatus for recording, or otherwise transmitting, video or other information signals, and in which at least a portion of the signal to be recorded, for example, the luminance component of a color video signal, is frequency modulated and then passed through a filter for limiting the frequency band of the resulting frequency modulated component or signal which is recorded; a signal processor, such as, an automatic gain control or limiter, acts on the frequency modulated output of the filter to eliminate or compensate for amplitude variations that may occur therein by reason of the filter, for example, at portions of the signal where substantial pre-emphasis was applied.

25 Claims, 19 Drawing Figures

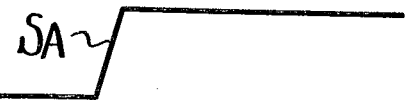
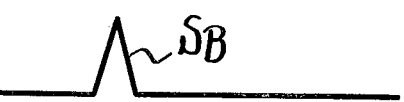
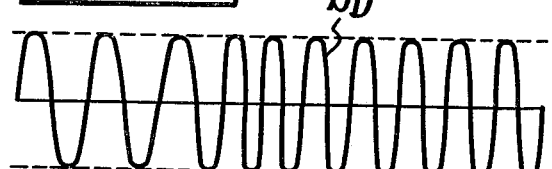
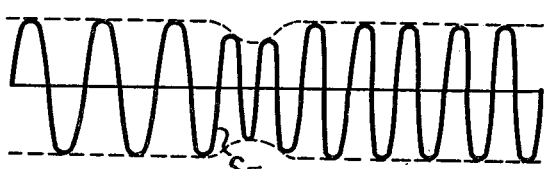
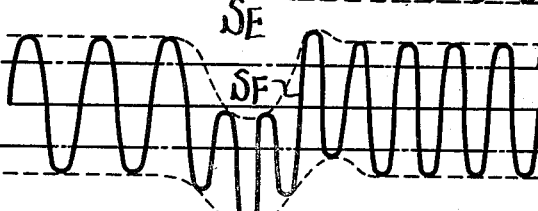
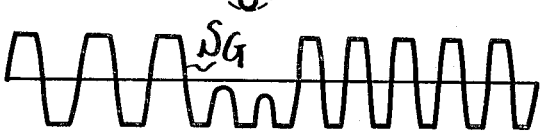

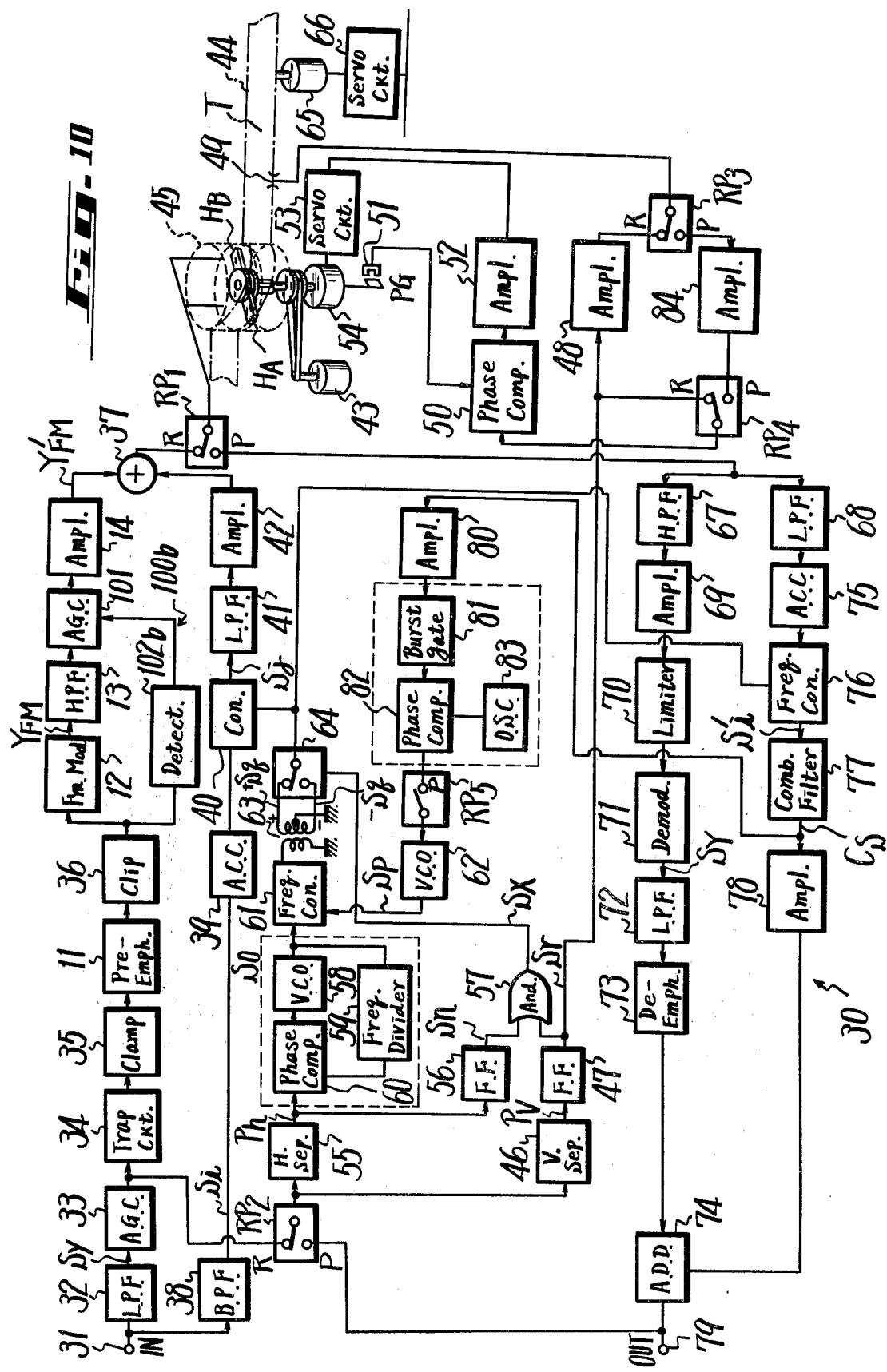

VIDEO RECORDER HAVING MEANS FOR MAINTAINING CONSTANT THE AMPLITUDE OF THE FREQUENCY-MODULATED SIGNAL

BACKGROUND OF THE INVENTION

1. Field of the Invention

This invention relates generally to the recording and reproducing or other transmission of information signals, such as, video signals, and more particularly is directed to the processing of such signals so as to eliminate or at least reduce the distortion thereof that may result from the angular modulation of at least a portion or component of the signals and then the filtering of the angularly modulated component or signals for the recording thereof.

2. Description of the Prior Art

It is well known that, in recording video signals, it is advantageous to record at least a portion of the video signals as a frequency modulation on a carrier having a relatively high frequency. More particularly, when recording color video signals which include a luminance component and a chrominance component, it is known to separate such components and then to frequency modulate the luminance component on the carrier having a relatively high frequency, while the chrominance component is frequency converted so as to have its frequency band shifted below the frequency band of the frequency modulated luminance component which passes through a suitable high pass filter, whereupon the filtered frequency modulated luminance component and the frequency converted chrominance component are combined to provide composite video signals which may be recorded in successive parallel tracks on a magnetic tape. Moreover, in the recording operation of existing apparatus for recording and reproducing video signals, at least a high frequency portion of the video signals, that is, the luminance component, is pre-emphasized in a pre-emphasis circuit prior to the frequency modulation thereof, and, in the reproducing or playback operation of such apparatus, the reproduced frequency modulated luminance component is demodulated and then de-emphasized in a de-emphasis circuit which has a characteristic complementary to that of the pre-emphasis circuit for reducing the so-called FM noise signal from the demodulated luminance component. However, in such existing apparatus, the high pass band filter acts to depress the amplitude of the frequency modulated component of the recorded video signals at the portion thereof which had been subjected to the greatest pre-emphasis and, upon reproduction, the amplitude variation of the frequency modulated component will be accentuated. When the frequency modulated component of the reproduced signal is demodulated, a distortion will appear at the pre-emphasized portion and, after de-emphasis of the demodulated luminance component, so-called "smear noise" will appear in the resulting reproduced video signals.

OBJECTS AND SUMMARY OF THE INVENTION

Accordingly, it is an object of this invention to provide an apparatus for processing a video or other information signal in connection with the recording and reproducing or other transmission thereof so as to reduce or eliminate a noise signal, for example, the above mentioned "smear noise" in the reproduced signal.

Another object is to provide an apparatus, as aforesaid, by which the frequency modulated video signal or component thereof is recorded with a uniform amplitude, notwithstanding the fact that the frequency modulating signal or component is filtered and was earlier pre-emphasized, for example, for reducing FM noise in the demodulated luminance component of the reproduced video signal.

Still another object is to provide an apparatus, as aforesaid, for recording and reproducing color video signals in successive parallel tracks on a magnetic tape with a high recording density, in which the luminance component is recorded as a frequency modulation of a carrier having a relatively high frequency while the chrominance component is frequency converted to a band below that of the frequency modulated luminance component, and in which the processing circuits are operative to substantially eliminate from the demodulated luminance component of the reproduced signals the FM noise signal characteristic of the relatively high carrier frequency of the frequency modulated luminance component and also the smear noise signal that may arise due to a pre-emphasis of the luminance component prior to the frequency modulation of the carrier thereby and the transmission of the frequency modulated luminance component through a high pass filter to the head or transducer means for recording the signals.

In accordance with an aspect of this invention, in recording or otherwise transmitting video or other information signals at least a portion thereof, for example, the luminance component of color video signals, is applied to an angular modulating means, such as, a frequency or phase modulator, whic has its output passed through a filter for limiting the frequency band of the resulting angularly modulated signal, and means are provided to compensate for any variations that may occur in the amplitude of the angularly modulated signal by reason of the filter, for example, at portions of the angularly modulated signal where at least the luminance component was subjected to substantial pre-emphasis. The means provided to compensate for amplitude variations of the frequency or phase modulated signal may simply be an automatic gain control or a limiter acting on the frequency or phase modulated signal prior to the recording of the latter.

The above, and other objects, features and advantages of this invention, will be apparent in the following detailed description of illustrative embodiments thereof which is to be read in connection with the accompanying drawings.

BRIEF DESCRIPTION OF THE DRAWINGS

FIGS. 3A to 3I are waveform diagrams to which reference will be made in explaining problems that arise when recording and reproducing video signals by means of the circuits of FIGS. 1 and 2, respectively;

FIG. 10 is a schematic block diagram of an apparatus according to another embodiment of this invention for recording and reproducing color video signals.

DESCRIPTION OF THE PREFERRED EMBODIMENTS

Figure 1:
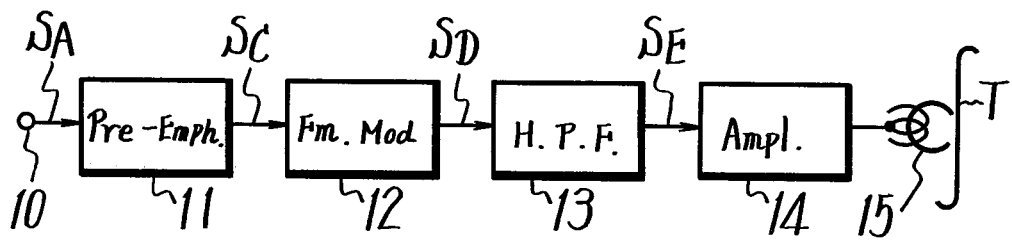
FIG. 1 is a block diagram showing a circuit for recording video signals in a prior art apparatus.

In order to facilitate understanding of the present invention, the problem solved thereby will be described with reference to conventional video signal recording and reproducing apparatus as shown on FIGS. 1 and 2, respectively. In a recording operation, a video signal $S_A$ (FIG. 3A) which is to be recorded is supplied from an input terminal 10 to a pre-emphasis circuit 11 (FIG. 1) in which high frequency components of the video signal are expanded (FIG. 3B) so as to provide a pre-emphasized video signal $S_C$ (FIG. 3C) as the output from circuit 11. The pre-emphasized video signal $S_C$ from circuit 11 is employed to angularly modulate a suitable carrier, for example, in a frequency modulator 12 (FIG. 1), so as to provide a frequency modulated signal $S_D$ (FIG. 3D) which is shown to have a constant amplitude. The frequency modulated signal from modulator 12 is passed through a high pass filter 13 for limiting the frequency band thereof which is applied through an amplifier 14 to a transducer 15, for example, in the form of a magnetic head, and by which the frequency modulated signal is recorded on a recording medium in the form of a magnetic tape T.

Figure 4:
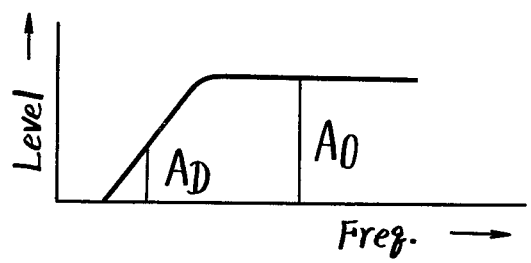
FIG. 4 is a graph showing the frequency characteristic of a high pass filter included in the circuit of FIG. 1.
Figure 5:
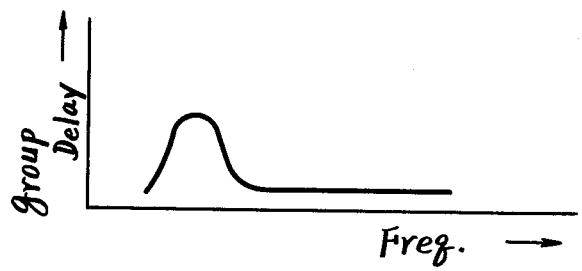
FIG. 5 is a graph showing the relation of group delay to frequency for the high pass filter of FIG. 1.

As shown on FIG. 3E, the frequency modulated signal $S_E$ which issues from high pass filter 13, and hence which is recorded on tape T, has its amplitude depressed at the portion thereof corresponding to that part of the modulating signal $S_C$ which was pre-emphasized in circuit 11. Such depressing of the amplitude of the frequency modulated signal results from the characteristic of high pass filter 13 which, as shown on FIG. 4, is relatively flat in the region of the frequency $A_O$ of the carrier of the frequency modulated signal $S_D$, whereas the characteristic of filter 13 declines or is attenuated at frequencies corresponding to lower sideband components $A_D$ of the frequency modulated signal. In other words, as shown on FIG. 5, the amount of group delay by filter 13 is relatively large at the region of lower sideband components of the frequency modulated signal.

Figure 6A:
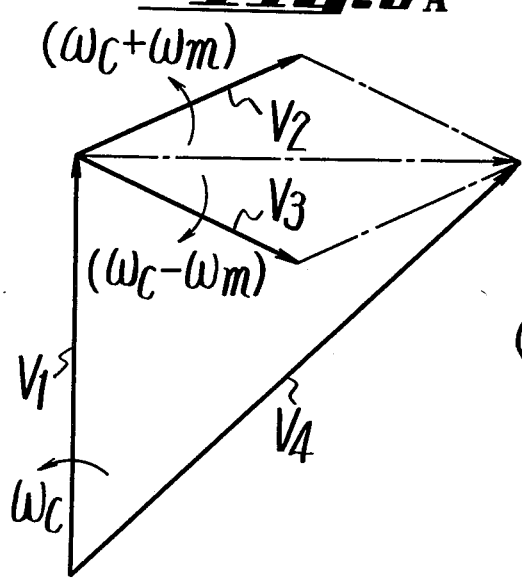
FIGS. 6A and 6B are vector diagrams to which reference will be made in explaining how the high pass filter in the circuit of FIG. 1 causes a variation in the amplitude of a frequency modulated signal to be recorded.
Figure 6B:
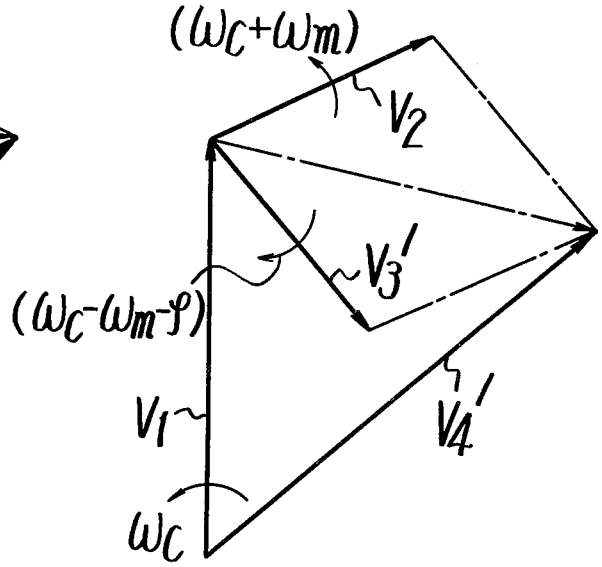

To the extent that lower sideband components delayed in filter 13 constitute an increasing proportion of the energy of the frequency modulated signal, the amplitude of the frequency modulated signal issuing from filter 13 is reduced or depressed. The foregoing will be apparent from a comparison of the vector diagrams shown on FIGS. 6A and 6B which respectively represent the frequency modulated signal before and after passage through filter 13. In FIG. 6A, the vector $V_1$ represents the carrier component of the frequency modulated signal, which carrier component has the angular velocity $\omega_c$, while the vectors $V_2$ and $V_3$ represent the upper and lower sideband components, respectively, of the frequency modulated signal resulting from an angular modulation of $\omega_m$. Further, the vector $V_4$ represents the resultant component and is, in effect, a measure of the amplitude of the frequency modulated signal. In the vector diagram of FIG. 6B, the vectors $V_1$ and $V_2$ representing the carrier component and the upper sideband component, respectively, are shown to exactly correspond to the vectors $V_1$ and $V_2$ on FIG. 6A, but the vector $V'_3$ representing the lower sideband component is shown to be subjected to a delay $\Phi$ in the high pass filter 13 on FIG. 1, with the result that the resultant component $V'_4$ representing the amplitude of the frequency modulated signal is relatively smaller than the resultant component $V_4$ realized in the absence of the delay.

As is known, when effecting frequency modulation of a carrier, pre-emphasis of the modulating signal, as at $S_C$ on FIG. 3C, increases the significant higher order harmonics of the sideband signals, with the result that increasing amounts of energy are included in the lower sideband components subject to the relatively large delay of high pass filter 13. Thus, in view of the dependence of the amplitude of the frequency modulated signal on the delay of the lower sideband components, as described above with reference to FIGS. 6A and 6B, and the relation of the proportion of the energy of the signal in the delayed lower sideband components to pre-emphasis of the frequency modulating signal, particularly at the high frequency portions of the latter, it follows that the frequency modulated signal $S_E$ obtained from filter 13 for recording on tape T will have a depressed or reduced amplitude at the regions or portions thereof corresponding to substantial pre-emphasis of the original video signal.

If the frequency modulated video signal $S_E$ to be recorded undergoes amplitude variation, as described above, such amplitude variation will be emphasized in the course of the actual recording and reproducing of the frequency modulated signal. Thus, when the frequency modulated video signal recorded on tape T is reproduced by a transducer or head 16 and applied to a reproducing amplifier 17 (FIG. 2), the reproduced frequency modulated video signal $S_F$ obtained from reproducing amplifier 17 has an emphasized amplitude variation, as shown on FIG. 3F.

As is conventional, the reproduced frequency modulated video signal $S_F$ from amplifier 17 is applied to a limiter circuit 18 having limiter levels indicated by the dot-dash lines L on FIG. 3F so that a limited waveform $S_G$ (FIG. 3G) will be obtained from limiter circuit 18. As is shown, the waveform $S_G$ may lack zero-crossover points at the portion thereof corresponding to the variation of the amplitude of the reproduced frequency modulated signal $S_F$. When the waveform $S_G$ from limiter circuit 18 has a portion lacking zero-crossover points, as on FIG. 3G, it is as if the frequency of the reproduced signal $S_F$ suddenly dropped to a very low value, which, in the case of frequency modulation, would occur if the carrier had been over modulated by the original video signal. Continuing with the reproducing circuit shown on FIG. 2, it will be seen that the limited $S_G$ is applied to a frequency demodulator 19 to provide a demodulated signal $S_H$ (FIG. 3H) which, as shown, has a waveform distortion at the portion of the demodulated signal corresponding to the portion of the original video signal which was substantially pre-emphasized. Finally, the demodulated signal $S_H$ is applied from demodulator 19 to de-emphasis circuit 20 having a characteristic substantially complementary to that of the pre-emphasis circuit 11 to provide a de-emphasized output video signal $S_I$ (FIG. 3I) to an output terminal 21. As shown, the output video signal $S_I$ has a reversed signal portion at the region thereof corresponding to the waveform distortion of the demodulated signal $S_H$.

In the case where the sharp change in level or high frequency portion of the original video signal $S_A$ corresponds to the demarcation between black and white regions of a video picture, the effect of the reversed signal portion of output video signal $S_I$ on a video picture reproduced from the latter will be to provide so-called "smear noise", that is, horizontal black lines extending from the edge of the black region into the adjacent white region of the reproduced video picture.

Figure 2:
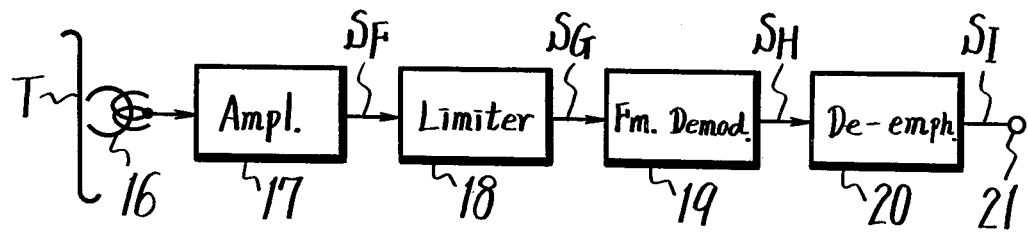
FIG. 2 is a block diagram of a circuit according to the prior art for reproducing video signals which have been recorded by the circuit of FIG. 1.
Figure 7:
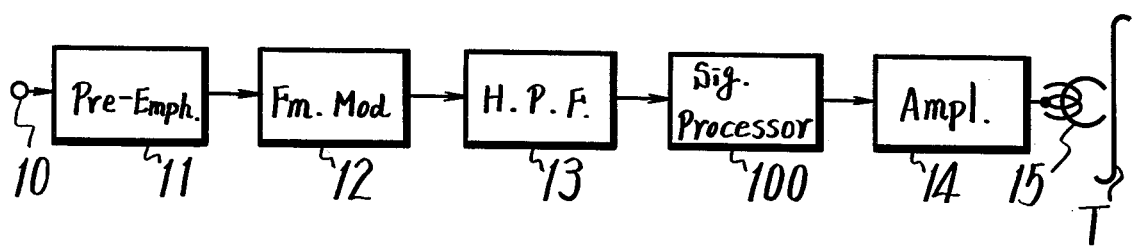
FIG. 7 is a block diagram which schematically illustrates a recording circuit according to this invention.

Referring now to FIG. 7, it will be seen that, in order to avoid the above described smear noise in accordance with this invention, a signal processing circuit 100 is interposed between the high pass filter 13 and amplifier 14 of the previously known recording circuit of FIG. 1 and functions to eliminate the variation of the amplitude of the frequency modulated video signal prior to the recording thereof. The signal processing circuit 100 may have various different forms to effect the desired elimination of amplitude variation in the output from filter 13. Thus, for example, the signal processing circuit 100 may be constituted by a "soft" limiter (not shown) having a limiting level that is relatively high, that is, only slightly less than the normal substantially constant amplitude of the frequency modulated signal, so as to remove only the amplitude variations resulting from high pass filter 13. The use of a "soft" limiter rather than a "deep" limiter to constitute the signal processing circuit 100 avoids the reappearance of the n-th order harmonic sideband signal beyond the band width limited by high pass filter 13 as would occur if the frequency modulated video signal from filter 13 was passed through a "deep" limiter.

Figure 8:
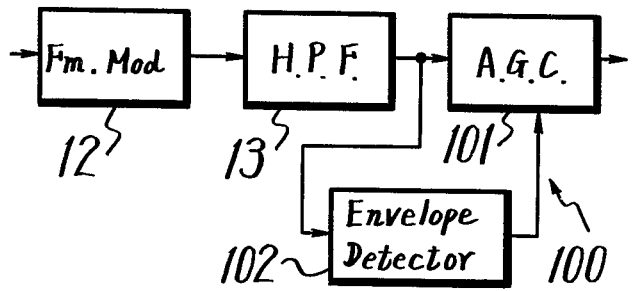
FIGS. 8 and 9 are fragmentary block diagrams of a portion of the circuit of FIG. 7 and show respective embodiments of the signal processor provided in each circuit in accordance with this invention for eliminating amplitude variations in a frequency modulated signal to be recorded.

Referring now to FIG. 8, it will be seen that, in another embodiment of this invention, the signal processing circuit 100 may be constituted by an automatic gain control circuit 101 interposed between the high pass filter 13 and amplifier 14 of FIG. 7 and being controlled by an envelope detector 102 which detects the amplitude of the frequency modulated video signal from filter 13 for correspondingly controlling the gain of circuit 101. More particularly, when detector 102 senses a depressed amplitude of the frequency modulated signal from filter 13, the gain of circuit 101 is correspondingly increased for eliminating such depression or reduction in the amplitude of the frequency modulated signal applied through amplifier 14 to head 15 on FIG. 7 for recording on tape T. although automatic gain control 101 is shown to be connected after filter 13 on FIG. 8, it will be apparent that such gain control circuit could be connected between frequency modulator 12 and high pass filter 13 so as to similarly compensate for or eliminate in advance the variations in the amplitude of the frequency modulated video signal that would otherwise result from the action of filter 13.

Figure 9:
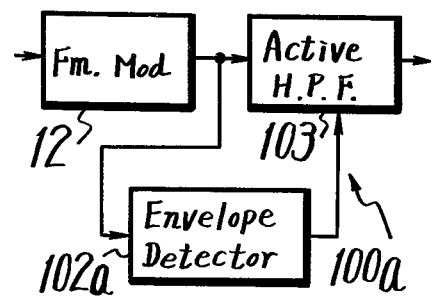

Referring now to FIG. 9, it will be seen that, in accordance with another embodiment of the present invention, the signal processing circuit 100a for eliminating variations in the amplitude of the frequency modulated signal recorded on the tape includes an envelope detector 102a which senses the output of frequency modulator 12 and correspondingly controls the cut off frequency of an active high pass filter 103 employed in place of the high pass filter 13 of FIG. 7 which has a fixed characteristic. More particularly, in response to the direction of the high frequency portion of the frequency modulated signal $S_D$ (FIG. 3D) corresponding to the pre-emphasized portion of the input video signal, detector 102a lowers the cutoff frequency of active filter 103 with the result that the lower sideband components of the frequency modulated signal are not delayed by filter 103 and, therefore, the action of filter 103 does not produce the amplitude variations described above with reference to filter 13.

In the embodiments of the invention described above with reference to FIGS. 7, 8 and 9, the video signals applied to the input terminal 10 to be recorded and reproduced were assumed to be monochrome or black and white video signals containing only luminance information. However, as shown on FIG. 10, the invention may also be desirably embodied in an apparatus 30 for recording and reproducing color video signals composed of both chrominance and luminance components, and in which elements corresponding to those previously described with reference to FIGS. 1 and 2 or FIGS. 7, 8 and 9 are identified by the same reference numerals. More particularly, it will be noted that, in the apparatus 30, the invention is particularly applied to the luminance component of the color video signals which has been pre-emphasized for eliminating the FM noise signal.

Referring to FIG. 10 in detail, it will be seen that, in the recording section of apparatus 30, an input terminal 31 receives the color video signal which includes luminance and chrominance components and is composed of line, field and frame intervals with blanking and synchronizing portions in each of those intervals. Such color video signal is applied from terminal 31 to a low pass filter 32 which transmits substantially only the luminance component or signal $S_Y$ to an automatic gain control circuit 33. The gain controlled luminance component from circuit 33 is applied through a trap circuit 34 to a clamp circuit 35 which clamps the sync-tip level of the luminance component to a fixed reference level. Thereafter, the clamped luminance component is passed through a pre-emphasis circuit 11 to a clip circuit 36 and, through the latter, to a frequency modulator 12 for frequency modulating a suitably high frequency carrier in the latter. The frequency modulated liminance component $Y_{FM}$ issuing from modulator 12 is passed through a high-pass filter 13 and the output of the latter is acted upon by an automatic gain control circuit 101 of a signal processing circuit 100b which, in accordance with this invention, functions similarly to the action of the signal processing circuit 100 described above with reference to FIG. 8 to eliminate variations in the amplitude of the frequency modulated luminance component applied from high pass filter 13 to a recording amplifier 14. However, in the case of signal processing circuit 100b, it will be seen that the automatic gain control circuit 101 is controlled by a detector 102b which detects the output of clip circuit 36 so as to increase the gain of circuit 101 in response to the detection of emphasized portions of the output of circuit 36. The frequency modulated luminance component from amplifier 14 is applied to one input of an adding or mixing circuit 37.

The color video signal applied to input terminal 31 is also supplied from the latter to a band pass filter 38 which separates the chrominance component $S_i$ from the color video signals and passes such chrominance component through an automatic color control circuit 39 to a frequency converter 40 in which the chrominance component is converted to a frequency band lower than that of the frequency modulated luminance component $Y'_{FM}$ supplied to mixing circuit 37. The resulting frequency converted component $S_j$ is supplied from frequency converter 40 through a low-pass filter 41 and a recording amplifier 42 to another input of mixing circuit 37 so as to be combined in the latter with the frequency modulated luminance component $Y'_{FM}$ for providing a composite signal S which, in the recording state or mode of apparatus 30, is supplied through record contact R of a record-playback switch $RP_1$ to rotary magnetic recording and reproducing heads $H_A$ and $H_B$.

As will be apparent, video tape recording and reproducing apparatus 30 may be of the helical scan type in which its rotary heads $H_A$ and $H_B$ are diametrically opposed and suitably driven, as by a motor 43, to alternately scan oblique tracks extending across the tape T as the latter is moved longitudinally, as by a motor-driven capstan 44, in a path that extends helically about a portion of the periphery of a guide drum 45 associated with the rotary heads as indicated in broken lines. The output of automatic gain control circuit 33 is also applied to an R contact of a record-playback switch $RP_2$ which, in its recording position, as shown, applies the same to a vertical synchronizing signal separating circuit 46. The vertical synchronizing signal $P_v$ thus separated from the incoming video signals is applied to a flip-flop circuit 47 for providing a control signal $S_r$ of rectangular waveform.

The output of flip-flop 47 is applied through an amplifier 48 to a record contact R of a record-playback switch $RP_3$ which, in its recording position, as shown, applies the resulting control signals to a fixed transducer or head 49 for recording by the latter at spaced apart locations along a longitudinal edge of the tape T. It will be understood that such control signals recorded by fixed head 49 occur in correspondence with the recording of color video signals in alternating, or every other one of the tracks so as to identify or distinguish between the tracks in which the chrominance component is recorded with first and second carriers, as hereinafter described in detail.

The control signal $S_r$ from flip-flop 47 is also employed in a servo system for regulating the rotary movements of heads $H_A$ and $H_B$. As shown, control signal $S_r$ is applied to the R contact of a record-playback switch $RP_4$ which, in its illustrated recording position, applies control signal $S_r$ to one of the inputs of a phase comparator 50. Another input of phase comparator 50 receives rotation indicating pulses PG from a generator 51 associated with the shaft of heads $H_A$ and $H_B$ for indicating the rotational position of the latter. Comparator 50 compares the phases of the control signals $S_r$ from flip-flop 47 and of the pulse signals PG from generator 51 and provides a corresponding brake-control or servo signal which is passed through an amplifier 52 to a servo circuit 53 for either suitably decreasing or increasing the braking force exerted by a brake 54 acting on the shaft of the rotary heads. Thus, the speed at which heads $H_A$ and $H_B$ is rotated by motor 43 is regulated so that the heads will commence to move along respective tracks on tape T at the commencement of alternating field intervals of the color video signals being recorded.

The gain controlled luminance component from circuit 33 is further shown to be applied through record-playback switch $RP_1$ to a horizontal synchronizing signal separator 55 which separates the horizontal synchronizing signals $P_h$ therefrom for application to a flip-flop 56. The resulting rectangular waveform or control signal $S_h$ from flip-flop 56 has successive high and low intervals each equal to one line interval H and is applied to one input of an AND circuit 57 which, at its other input, receives the rectangular waveform or signal $S_r$ from flip-flop 47 having successive high and low intervals each equal to one field interval. As a result of the foregoing, the output or control signal $S_x$ from AND circuit 57 remains low during each field interval recorded in a track $T_A$ and goes high only during alternate line intervals of each field interval recorded in a next adjacent track $T_B$. In the illustrated recording and reproducing apparatus 30, such output or control signal $S_x$ from AND circuit 57 is employed for controlling the establishment of different carriers for the frequency converted chrominance component $S_j$ to be recorded in tracks that are next adjacent to each other, with such carriers differing from each other in their polarity characteristics as described in detail in U.S. Pat. Nos. 3,925,910, 4,007,482 and 4,007,084, each of which has a common assignee herewith.

In the illustrated apparatus 30, the circuit for frequency converting the chrominance component $S_i$ and for providing the different carriers with which the frequency converted chrominance component $S_j$ is recorded in tracks that are next adjacent each other is shown to include a voltage controlled oscillator 58 providing an output $S_o$ with a center frequency of, for example, $44f_H$. The output $S_o$ of oscillator 59 is applied to a frequency divider 59 to be divided in the latter by 44, and the output of divider 59 is applied to a comparator 60 which also receives the separated horizontal synchronizing signals $P_h$ from separator 55. It will be appreciated that comparator 60 compares the frequency of the output from divider 59 with the frequency $f_H$ of the separated horizontal synchronizing signals $P_h$ and, upon any deviation therebetween, provides a suitable control voltage to voltage controlled oscillator 58 for automatically maintaining the output $S_o$ at a frequency of $44f_H$.

The output $S_o$ of oscillator 58 is applied to a frequency converter 61 in which the output $S_o$ is frequency converted by a frequency converting signal $S_p$ from a voltage controlled oscillator 62 having a center frequency of $f_i - \frac{1}{4}f_H$, in which $f_i$ is the original or standard carrier frequency of the chrominance component $S_i$ of the color video signals being recorded. The output of frequency converter 61 is applied to a transformer 63 having a center tapped secondary with two outputs ± of opposite polarity at which frequency converting signals $+S_q$ and $-S_q$, respectively appear. Such frequency converting signals $+S_q$ and $-S_q$ are of opposite phase or polarity and have the frequency $(f_i + 44f_H - \frac{1}{4}f_H)$. The frequency converting signals $+S_q$ and $-S_q$ are alternatively applied to frequency converter 40 through a switching circuit 64 which is controlled by the control signal $S_x$ from AND circuit 57 so that frequency converting signal $+S_q$ is applied to converter 40 whenever control signal $S_x$ has a low value, and frequency converting signal $-S_q$ is applied to converter 40 whenever control signal $S_x$ has a high value. Frequency converting signals $+S_q$ and $-S_q$ alternately applied to frequency converter 40 are effective in the latter to convert the carrier of the chrominance component from its original carrier frequency $f_i$ to a relatively lower carrier frequency $f_c = 44f_H - \frac{1}{4}f_H$. As a result of the foregoing, the frequency converted chrominance component $S_j$ applied from frequency converter 40 through filter 41 and amplifier 42 to mixing or adding circuit 37 has a frequency band lower than that of the frequency modulated luminance component $Y'_{FM}$. During intervals when the frequency converting signal $+S_q$ is applied to frequency converter 40, the polarity or phase of the carrier of the frequency converted chrominance component $S_j$ is reversed as compared with the phase or polarity of such carrier during the interval when the frequency converting signal $+S_q$ is applied to frequency converter 40.

It will also be noted that the carrier frequency $f_c$ of the frequency converted chrominance component $S_j$ satisfies the equation $$f_c = \tfrac{1}{4}f_H(2m-1)$$

in which m is a whole positive integer. Of course, in the present case, in which $f_c = 44f_H - \frac{1}{4}f_H$, the value m in the above equation is 88.

As a result of the described selection of the carrier frequency of the frequency converted chrominance component $S_j$, the second harmonic of the carrier of the frequency converted chrominance component is interleaved with the luminance component so as to avoid beat interference therebetween. By avoiding such beat interference, the frequency converted chrominance component can be recorded with a relatively high amplitude in respect to the amplitude of the frequency modulated luminance component for obtaining a good signal-to-noise (S/N) ratio of the chrominance component, as described in detail in U.S. Pat. No. 3,730,983, having a common assignee herewith.

As already noted, during recording, the frequency converted chrominance component $S_j$ and the frequency modulated luminance component $Y'_{FM}$ are combined in mixing circuit 37 with the frequency converted chrominance component amplitude modulating the frequency modulated luminance component to provide the combined or composite signal S which is applied through record-playback switch RP1, in the record position of the latter, to heads $H_A$ and $H_B$ for recording by such heads in successive parallel tracks on tape T. In the apparatus 30, the speed of rotation of a motor 65 for driving capstan 44 is preferably controlled through a suitable servo circuit 66 so as to maintain a desired relative arrangement of the successive tracks on tape T.

The record-playback switches RP1–RP4 are preferably ganged or interconnected so as to be simultaneously changed-over from their recording positions shown on FIG. 10 to their reproducing or playback positions in which the movable contact of each of the enumerated switches engages a respective playback contact P. In the reproducing or playback section of apparatus 30, the playback terminal P of switch RP1 is connected to a high pass filter 67 and a low pass filter 68 so as to apply to such filters the signals being alternately reproduced by heads $H_A$ and $H_B$ from the successive parallel tracks on tape T. The filters 67 and 68 respectively separate the frequency modulated luminance component $Y'_{FM}$ and the frequency converted chrominance component $S_j$ from the reproduced signals. The frequency modulated luminance component $Y'_{FM}$ separated from the reproduced signals is passed through an amplifier 69 and a limiter 70 to a frequency demodulator 71 so as to obtain a demodulated luminance component $S'_Y$. The demodulated luminance component $S'_Y$ is then passed through a low pass filter 72 and a de-emphasis circuit 73 which has a characteristic substantially complementary to that of the pre-emphasis circuit 11. The resulting de-emphasized luminance component is then applied to an adding or mixing circuit 74.

The frequency converted chrominance component $S_j$ separated from the reproduced signals by filter 68 is applied through an automatic color control circuit 75 to a frequency reconverter 76 which alternately receives the frequency converting signals $+S_q$ and $-S_q$ from switching circuit 64, and by which the carrier of the reproduced chrominance component $S_j$ is reconverted to the original carrier frequency $f_i$. The resulting frequency reconverted chrominance component $S'_i$ is passed through a comb filter 77 in which, as hereinafter described in detail, chrominance components of crosstalk signals are cancelled or suppressed so that only the chrominance component $C_s$ of the video signals being reproduced from a particular track by the head $H_A$ $H_B$, respectively, is passed through an amplifier 78 to mixing circuit 74 for combining in the latter with the luminance component and thereby forming the desired reproduced color video signal applied to output terminal 79.

The output of comb filter 77 is also shown to be supplied through an amplifier 80 to a burst gate 81 which extracts burst signals from the reconverted chrominance signal component $S'_i$ and applies the extracted burst signals to one input of a phase comparator 82. An oscillator 83 provides an output at the standard or original carrier frequency $f_i$ for the chrominance component, and such output is applied to a second input of comparator 82. The output of phase comparator 82 is connected to a playback terminal P of a switch RP5 which is also ganged or interconnected with the record-playback and switches RP1–RP4 so as to be effective, in the playback or reproducing mode of operation of apparatus 30, to apply the output of phase comparator 82 as a control voltage to the voltage controlled oscillator 62. It will be apparent that, in the reproducing mode of operation, any phase difference between the burst signals extracted by gate 81 from the reconverted chrominance component and the output of oscillator 83 causes comparator 82 to apply a suitable control voltage to voltage control oscillator 62 for effecting a required change in the phase of the converting signals $+S_q$ and $-S_q$, whereby to achieve an automatic phase control function for eliminating so-called jitter from a picture or image produced by a cathode ray tube in response to color video signals obtained at output terminal 79.

In the reproducing mode of operation of apparatus 30, control signal $S_x$ for operating switching circuit 64 is again obtained from AND circuit 57 in response to the control signals $S_r$ and $S_h$ from flip-flops 47 and 56, respectively. However, in the reproducing mode of operation, the reproduced video signals from mixing circuit 74 are applied through contact P of record-playback switch RP2 to the vertical and horizontal synchronizing signal separating circuits 46 and 55 so that flip-flops 47 and 56 are respectively triggered by the vertical and horizontal synchronizing signals separated from the reproduced color video signals. Further, in the reproducing mode of operation, fixed head 49 reproduces the recorded control signals which distinguish the tracks that are next adjacent each other, and the control signals reproduced by head 49 are applied to one input of phase comparator 50 through contact P of record-playback switch RP$_3$, an amplifier 84 and contact P or record-playback switch RP$_4$. The other input of phase comparator 50, as before, receives the rotation indicating pulses from generator 51 so that phase comparator 50 applies a suitable control signal through amplifier 52 to servo circuit 53 for causing brake 54 to suitably control the rotation of heads H$_A$ and H$_B$ by motor 43. It will be apparent that the described servor control arrangement is effective, in the reproducing mode of operation, to insure that each of the tracks on tape T will be scanned by the same head H$_A$ or H$_B$ which was employed for recording video signals in such track.

The above described recording and reproducing apparatus 30 operates as follows:

RECORDING MODE OF OPERATION

In the recording mode of operation of apparatus 30, each of switches RP$_1$-RP$_5$ is in its recording position so as to engage the respective recording contact R, as shown on FIG. 10. In the recording operation of apparatus 30, the control signal S$_r$ from flip-flop 47 triggered by vertical synchronizing signals P$_v$ separated from the luminance component S$_Y$ of the color video signals applied to input terminal 31 is compared, in phase comparator 50, with the output of the rotation indicating pulses from generator 51 so as to provide a suitable servo control signal by which the rotary movements of heads H$_A$ and H$_B$ are controlled for causing such heads to commence the scanning of alternating tracks on the tape at the commencement of respective field intervals of the color video signals.

During recording, the luminance component S$_Y$ of the color video signal applied to input terminal 31 is subjected to pre-emphasis in circuit 11 prior to frequency modulation in modulator 12, and automatic gain control circuit 101 and detector 102$b$ ensure that the frequency modulated luminance component Y'$_{FM}$, even after passage through high pass filter 13, will have a uniform amplitude.

Further, during recording, the chrominance component S$_i$ separated from the incoming color video signals and having the original or standard carrier frequency f$_i$, is acted upon in frequency converter 40 by the frequency converting signal +S$_q$ or −S$_q$ so as to provide the frequency converted chrominance component S$_j$ with the reduced carrier frequency $f_c = 44f_H - \frac{1}{2}f_H$. Thus, the frequency band of the frequency converted chrominance component S$_j$ is lower than that of the frequency modulated luminance component Y'$_{FM}$ with which it is combined in mixing circuit 37 to constitute the composite or combined signal S alternately recorded by heads H$_A$ and H$_B$ in the successive tracks on tape T. The alternative application of frequency converting signals +S$_q$ and −S$_q$ to frequency converter 40 is determined by switching circuit 64 which, in turn, is controlled by the control signal S$_x$ from AND circuit 57. Since frequency converting signals +S$_q$ and −S$_q$ are of opposite phase or polarity, the effect thereof in frequency converter 40 will be to provide the resulting frequency converted chrominance component S$_j$ with respective carriers C$_a$ and −C$_a$ which are similarly of opposed phase or polarity. By reason of the previously described configuration of control signal S$_x$, during each field interval recorded by head H$_A$, converting signal +S$_q$ is continuously applied to frequency converter 40 with the result that the successive line intervals of each field interval recorded by head H$_A$ in a respective track are provided with a carrier of the same polarity. On the other hand, during successive line intervals of each field interval recorded by head H$_B$ in a respective track, frequency converting signals +S$_q$ and −S$_q$ are alternately applied to frequency converter 40 so that the successive line intervals of each field interval recorded by head H$_B$ are alternately recorded with the carriers C$_a$ and −C$_a$ of opposed polarity.

REPRODUCING MODE OF OPERATION

In the reproducing mode of operation of apparatus 30, switches RP$_1$-RP$_5$ are changed over to engage their respective reproducing or playback terminals P. Thus, signals reproduced alternately by heads H$_A$ and H$_B$ from the successive tracks on tape T are applied through switch RP$_1$ to filters 67 and 68 which respectively separate the frequency modulated luminance component Y'$_{FM}$ and the frequency converted chrominance component S$_j$ from the reproduced signals. In the reproducing operation of apparatus 30, the rotation of heads H$_A$ and H$_B$ is regulated, on the basis of a comparison of the control signals reproduced from the tape by fixed head 49 with the rotation indicating signals from generator 51, so that the signals recorded in next adjacent tracks of tape T by heads H$_A$ and H$_B$ will be reproduced by such heads H$_A$ and H$_B$, respectively. Further, as a result of such servo control of the rotation of heads H$_A$ and H$_B$ during reproducing, the control signal S$_x$ from AND circuit 57 which controls switching circuit 64 has the same relationship to the operative positioning of heads H$_A$ and H$_B$ as it has during the recording operation.

The frequency modulated luminance component Y'$_{FM}$ separated from the reproduced signals is demodulated in frequency demodulator 71 so as to obtain the demodulated luminance component which is de-emphasized in circuit 73 so as to correspond to the luminance component of the original color video signal. Since the luminance component, as recorded and reproduced, is free of the amplitude variations illustrated on FIGS. 3E and 3F by reason of the action of the circuit 100$b$ provided according to this invention, the luminance component applied to the mixing circuit 74 is free of any distortions as would cause "smear" noise in a picture reproduced from the color video signal derived from terminal 79.

During reproducing operation, the interfering signal due to cross-talk in respect to the luminance component of the video signals may be eliminated, at least in part, by providing different azimuth angles for the air gaps of heads H$_A$ and H$_B$, as is well known.

Considering the frequency converted chrominance component, it should be noted that the effect of providing the same carriers C$_a$, −C$_a$ of reversed phase or polarity in successive line intervals or areas of each track recorded by head H$_B$ is to provide a new carrier C$_b$ having frequency components offset by $\frac{1}{2}f_H$, or interleaving with respect to the frequency components of the carrier C$_a$ with which the frequency converted chrominance component is recorded in the next adjacent track by head H$_A$, as described in detail in U.S. Pat. No. 3,925,801.

Accordingly, in the reproducing operation of apparatus 30, when, for example, head H$_A$ scans a track T$_A$ on tape T for reproducing the frequency converted chrominance component recorded therein with the carrier C$_a$, the undesired or crosstalk signal simultaneously reproduced by head H$_A$ from the next adjacent track T$_B$ has its frequency converted chrominance component provided with a carrier in frequency interleaving relation to the carrier $C_a$.

During the reproducing operation of apparatus 30, switching circuit 64 is again controlled by control signal $S_x$ from AND circuit 57 so that frequency reconverter 76 continuously receives the frequency converting signal $+S_q$ during the scanning of a track by head $H_A$, and so that frequency converting signals $+S_q$ and $-S_q$ are alternately applied to frequency reconverter 76 for successive line intervals during the scanning of a track by head $H_B$. As a result of the foregoing, during the scanning of a track by head $H_A$, frequency reconverter 76 reconverts the carrier $C_a$ of the chrominance component then being reproduced to a carrier having the original or standard carrier frequency $f_i$, while the carrier of the cross-talk chrominance component has its frequency similarly shifted so as to be spaced midway between the principal side bands of the desired carrier. Similarly, during the scanning of a track by head $H_B$, frequency converter 76 frequency converts the carrier $C_b$ of the chrominance component being reproduced from such track to a carrier also having the original or standard frequency $f_i$, while the carrier of the cross-talk chrominance component then being reproduced has its frequency similarly shifted so as to be spaced midway between the principal side bands of the desired reconverted carrier. Thus, the reconverted carriers of the chrominance component reproduced during alternate field intervals both have the same carrier frequency $f_i$, while the chrominance component of the undesired or cross-talk signal is, in each case, spaced midway between the principal side bands of the desired carrier and can be eliminated by the comb filter 77 to yield the desired reconverted chrominance component $C_s$ free of any cross-talk chrominance component.

In the above, the invention has been described as applied to a video signal, or luminance component thereof, which is frequency modulated prior to the recording and reproducing, or other transmission thereof. However, it will be apparent that the invention can be similarly applied to other information signals which are angularly modulated, for example, phase modulated, rather than being frequency modulated, and in which the angularly modulated signal is then passed through a filter which might cause the amplitude variation at regions of sharp modulation.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus for processing a video signal to be recorded, comprising
pre-emphasis means for pre-emphasizing a frequency signal in said video signal to produce a pre-emphasized video signal;
modulating means for frequency modulating a carrier with the pre-emphasized video signal to be recorded;
high pass filter means for limiting the frequency band of the frequency modulated signal from said modulating means, in which said high pass filter is an active filter adapted to have its cut-off frequency varied; and
means for maintaining a constant amplitude of said frequency modulated signal as derived from said filter means for recording on a record medium, wherein said maintaining means is operative to decrease said cut-off frequency in correspondence with the pre-emphasis of the video signal.

2. Apparatus according to claim 1; in which said means for maintaining said constant amplitude of the frequency modulated signal derived from said filter means includes a detector responsive to the frequency of said frequency modulated signal from said modulating means.

3. Apparatus according to claim 1; in which said video signal is the luminance component of a color video signal which further has a chrominance component; and
further comprising means for frequency converting said chrominance component to a lower frequency band than that of the frequency modulated luminance component, and means for combining the frequency converted chrominance component with the frequency modulated luminance component to provide a composite signal for recording on the record medium.

4. Apparatus according to claim 3; in which said chrominance component of the color video signals has an original carrier frequency; and in which said means for frequency converting said chrominance component includes a frequency converter receiving said chrominance component with said original carrier frequency thereof, and means for producing a frequency converting signal supplied to said frequency converter for causing the latter to convert said original carrier frequency to a relatively lower carrier frequency.

5. Apparatus according to claim 4; in which said original and relatively lower carrier frequencies of the chrominance component are in frequency interleaving relation to each other and to the horizontal synchronizing signal frequency of the video signal.

6. Apparatus according to claim 5; in which said relatively lower carrier frequency has its second harmonic in frequency interleaving relation to said horizontal synchronizing signal frequency of the video signals.

7. Apparatus according to claim 6; in which said relatively lower carrier frequency of the frequency converted chrominance component is selected to satisfy the following equation:

$$f_c = \tfrac{1}{4} f_H (2m-1)$$

in which $f_c$ is said relatively lower carrier frequency, $f_H$ is said horizontal synchronizing signal frequency of the video signal, and m is a whole positive integer.

8. Apparatus according to claim 1; in which said video signal is the luminance component of a color video signal which further has a chrominance component and which is comprised of field intervals and predetermined numbers of line intervals included in each field interval and being recorded in respective areas of successive parallel tracks on the record medium; and further comprising means for providing different first and second carriers for said chrominance component, carrier selecting means for alternatively selecting the first and second carriers for said chrominance component to be recorded in the tracks, and control means for the carrier selecting means operative to cause the recording of said chrominance component with the first and second carriers therefor, respectively, in said tracks which are next adjacent each other.

9. Apparatus according to claim 8, in which said first and second carriers for the chrominance component have different polarity characteristics.

10. Apparatus according to claim 9; in which the polarity of said first carrier for the chrominance component is constant during successive line intervals of the video signal being recorded in one of the tracks, and the polarity of the second carrier for the chrominance component is reversed after each predetermined number of said line intervals of the video signal being recorded in the next adjacent track.

11. Apparatus for processing a video signal to be recorded, comprising
pre-emphasis means for pre-emphasizing a frequency signal in said video signal to produce a pre-emphasized video signal;
modulating means for frequency modulating a carrier with the pre-emphasized video signal to be recorded;
high pass filter means for limiting the frequency band of the frequency modulated signal from said modulating means; and
means for maintaining a nearly constant amplitude of said frequency modulated signal as derived from said filter means for recording on a record medium, including soft limiter means acting on the output of said filter means.

12. Apparatus for processing a video signal to be recorded, comprising
pre-emphasis means for pre-emphasizing a frequency signal in said video signal to produce a pre-emphasized video signal;
modulating means for frequency modulating a carrier with the pre-emphasized video signal to be recorded;
high pass filter means for limiting the frequency band of the frequency modulated signal from said modulating means; and
means for maintaining a constant amplitude of said frequency modulated signal as derived from said filter means for recording on a record medium, including automatic gain control means coupled to the output of said filter means for directly regulating the amplitude of the signal at said output, and detector means for controlling the gain of said gain control means in the sense to maintain said constant amplitude.

13. Apparatus for processing a video signal to be recorded, comprising
modulating means for frequency modulating a carrier with the video signal to be recorded;
high pass filter means for limiting the frequency band of the frequency modulated signal from said modulating means; and
means for maintaining a constant amplitude of said frequency modulated signal as derived from said filter means for recording on a record medium, including automatic gain control means acting on the output of said filter means, and detector means for controlling the gain of said gain control means in the sense to maintain said constant amplitude, in which said detector means is responsive to a pre-emphasized video signal in advance of said modulating means.

14. Apparatus for recording and reproducing video signals in successive parallel tracks on a record medium, comprising:
transducer means for scanning said successive parallel tracks on the record medium;
a recording section including modulating means for frequency modulating at least a portion of said video signals on a carrier, record signal processing means including pre-emphasizing means operative on at least said portion of the video signals in advance of the frequency modulation of said carrier therewith, high pass filter means for limiting the frequency band of the frequency modulated signal applied from said modulating means to said transducer means for recording by the latter in said tracks scanned thereby, in which said high pass filter means is an active filter adapted to have its cut-off frequency varied, and means for maintaining a constant amplitude of said frequency modulated signal as derived from said filter means, wherein said maintaining means is operative to vary said cut-off frequency in correspondence with the pre-emphasis of said portion of the video signals and
a reproducing section including demodulating means for frequency demodulating the frequency modulated signals reproduced by said transducer means from the successive parallel trakcs on the record medium, and reproduced signal processing means operative on the demodulated signals from said demodulating means and including de-emphasizing means for providing an amount of de-emphasis to said demodulated signals which is substantially complementary to the amount of emphasis provided by said pre-emphasizing means.

15. Apparatus according to claim 14; in which said video signals are color video signals containing a luminance component which constitutes said portion of the video signals and further containing a chrominance component having an original carrier frequency; and
in which said recording section further includes means for frequency converting said chrominance component to a lower frequency band than that of the frequency modulated luminance component, and means for combining the frequency converted chrominance component with the frequency modulated luminance component to provide a composite signal for recording on the record medium; and
said reproducing section further includes means for individually separating the frequency modulated luminance component and the frequency converted chrominance component from the reproduced composite signals, and means for frequency reconverting the separated frequency converted chrominance component back to said original carrier frequency therefor.

16. Apparatus according to claim 15; in which said means for frequency converting said chrominance component includes a frequency converter receiving said chrominance component with said original carrier frequency thereof, and means for producing a frequency converting signal supplied to said frequency converter for causing the latter to convert said original carrier frequency to a relatively lower carrier frequency; and
in which said means for frequency reconverting the separated frequency converted chrominance component includes another frequency converter receiving said separated frequency converted chrominance component of the reproduced composite signals, and means for producing a frequency reconverting signal supplied to said other frequency converter for causing the latter to convert said relatively lower carrier frequency to said original carrier frequency.

17. Apparatus according to claim 16; in which said original and relatively lower carrier freqiencies of the chrominance component are in frequency interleaving relation to each other and to the horizontal synchronizing signal frequency of the video signals.

18. Apparatus according to claim 17; in which said relatively lower carrier frequency has its second harmonic in frequency interleaving relation to said horizontal synchronizing signal frequency of the video signals.

19. Apparatus according to claim 14; in which said video signals are color video signals comprised of field intervals and predetermined numbers of line intervals included in each field interval and being recorded in respective areas of said successive parallel tracks, and said color video signals contain a luminance component which constitutes said portion of the video signals and a chrominance component; said recording section further includes means for providing different first and second carriers for said chrominance component, carrier selecting means for alternatively selecting the first and second carriers for said chrominance signals to be recorded in the tracks, and control means for the carrier selecting means operative to cause the recording of said chrominance component with the first and second carriers therefor, respectively, in said tracks which are next adjacent each other; and said reproducing section further includes transducer means for reproducing the frequency modulated luminance component and the chrominance component recorded in each of the tracks along with cross-talk signals from tracks next adjacent thereto, and means for providing the chrominance component reproduced from each of said tracks with a common carrier and for eliminating the cross-talk signals therefrom on the basis of said different first and second carriers with which the chrominance component is recorded in the tracks which are next adjacent each other.

20. Apparatus according to claim 19; in which said means for eliminating the cross-talk signals includes a comb filter.

21. Apparatus according to claim 19; in which said first and second carriers for the chrominance component have different polarity characteristics.

22. Apparatus according to claim 21; in which the polarity of said first carrier for the chrominance component is constant during successive line intervals of the video signals being recorded in one of the tracks, and the polarity of the second carrier for the chrominance component is reversed after each predetermined number of said line intervals of the video signals being recorded in the next adjacent track.

23. Apparatus according to claim 14; in which said means for maintaining said constant amplitude includes a detector responsive to the frequency of said frequency modulated signal.

24. Apparatus for recording and reproducing video signals in successive parallel tracks on a record medium, comprising:
transducer means for scanning said successive parallel tracks on the record medium;
a recording section including modulating means for frequency modulating at least a portion of said video signals on a carrier, record signal processing means including pre-emphasizing means operative on at least said portion of the video signals in advance of the frequency modulation of said carrier therewith, high pass filter means for limiting the frequency band of the frequency modulated signal applied from said modulating means to said transducer means for recording by the latter in said tracks scanned thereby, and means for maintaining a nearly constant amplitude of said frequency modulated signal as derived from said filter means, in which said means for maintaining said nearly constant amplitude is constituted by soft limiter means acting on the output of said filter means and
a reproducing section including demodulating means for frequency demodulating the frequency modulated signals reproduced by said transducer means from the successive parallel tracks on the record medium, and reproduced signal processing means operative on the demodulated signals from said demodulating means and including de-emphasizing means for providing an amount of de-emphasis to said demodulated signals which is substantially complementary to the amount of emphasis provided by said pre-emphasizing means.

25. Apparatus for recording and reproducing video signals in successive parallel tracks on a record medium, comprising:
transducer means for scanning said successive parallel tracks on the record medium;
a recording section including modulating means for frequency modulating at least a portion of said video signals on a carrier, record signal processing means including pre-emphasizing means operative on at least said portion of the video signals in advance of the frequency modulation of said carrier therewith, filter means for limiting the frequency band of the frequency modulated signal applied from said modulating means to said transducer means for recording by the latter in said tracks scanned thereby, and means for maintaining a constant amplitude of said frequency modulated signal as derived from said filter means, including automatic gain control means acting on the output of said filter means, and, detector means for controlling the gain of said automatic gain control means in the sense to maintain said constant amplitude and
a reproducing section including demodulating means for frequency demodulating the frequency modulated signals reproduced by said transducer means from the successive parallel tracks on the record medium, and reproduced signal processing means operative on the demodulated signals from said demodulating means and including de-emphasizing means for providing an amount of de-emphasis to said demodulated signals which is substantially complementary to the amount of emphasis provided by said pre-emphasizing means.

* * * * *